United States Patent
Park et al.

(10) Patent No.: US 8,867,280 B2
(45) Date of Patent: Oct. 21, 2014

(54) 3D STACKED NAND FLASH MEMORY ARRAY ENABLING TO OPERATE BY LSM AND OPERATION METHOD THEREOF

(71) Applicant: Seoul National University R&DB Foundation, Seoul (KR)

(72) Inventors: Byung-Gook Park, Seoul (KR); Wandong Kim, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 2 days.

(21) Appl. No.: 13/760,320

(22) Filed: Feb. 6, 2013

(65) Prior Publication Data

US 2013/0223142 A1  Aug. 29, 2013

(30) Foreign Application Priority Data

Feb. 24, 2012  (KR) ........................ 10-2012-0019349

(51) Int. Cl.
| | | |
|---|---|---|
| G11C 16/04 | (2006.01) | |
| G11C 16/10 | (2006.01) | |
| G11C 16/12 | (2006.01) | |
| G11C 5/02 | (2006.01) | |
| G11C 5/06 | (2006.01) | |
| G11C 11/40 | (2006.01) | |
| H01L 29/792 | (2006.01) | |
| H01L 27/115 | (2006.01) | |
| G11C 16/06 | (2006.01) | |

(52) U.S. Cl.
CPC .............. *G11C 11/40* (2013.01); *H01L 29/792* (2013.01); *G11C 2213/71* (2013.01); *G11C 5/02* (2013.01); *G11C 16/06* (2013.01); *G11C 16/04* (2013.01); *H01L 27/11573* (2013.01); *H01L 27/11582* (2013.01); *G11C 16/0483* (2013.01); *G11C 16/10* (2013.01)
USPC ............ 365/185.24; 365/185.05; 365/185.17; 365/51; 365/72

(58) Field of Classification Search
CPC .... G11C 16/10; G11C 16/0483; G11C 16/04; G11C 5/06; G11C 2213/71; G11C 5/02
USPC ...................... 365/185.17, 185.24, 51, 63, 72
See application file for complete search history.

(56) References Cited

U.S. PATENT DOCUMENTS

| | | | | |
|---|---|---|---|---|
| 5,812,454 | A | * | 9/1998 | Choi ........................ 365/185.17 |
| 7,602,028 | B2 | | 10/2009 | Son et al. |
| 8,588,001 | B2 | * | 11/2013 | Sim et al. ................ 365/185.17 |
| 2005/0099847 | A1 | * | 5/2005 | Ichige et al. ............. 365/185.17 |
| 2008/0179659 | A1 | * | 7/2008 | Enda et al. .................... 257/326 |
| 2011/0038211 | A1 | * | 2/2011 | Yoon et al. ............... 365/185.17 |

(Continued)

FOREIGN PATENT DOCUMENTS

| | | |
|---|---|---|
| KR | 10-1036155 | 5/2011 |
| KR | 10-2011-0111166 | 10/2011 |

*Primary Examiner* — Ly D Pham
(74) *Attorney, Agent, or Firm* — Gerald E. Hespos; Michael J. Porco; Matthew T. Hespos (57) ABSTRACT

This invention provides a 3D stacked NAND flash memory array and operation method thereof enabling to operate by LSM (a layer selection by multi-level operation) and to get rid of the waste of unnecessary areas by minimizing the number of SSLs needed for a layer selection though the number of layers vertically stacked is increased.

11 Claims, 8 Drawing Sheets

(56) References Cited

U.S. PATENT DOCUMENTS

| | | | |
|---|---|---|---|
| 2011/0266607 A1* | 11/2011 | Sim et al. | 257/314 |
| 2011/0280075 A1* | 11/2011 | Shirota et al. | 365/185.17 |
| 2012/0140562 A1* | 6/2012 | Choe et al. | 365/185.18 |
| 2013/0092994 A1* | 4/2013 | Shim et al. | 257/314 |
| 2013/0092996 A1* | 4/2013 | Lee et al. | 257/315 |
| 2013/0114345 A1* | 5/2013 | Lee | 365/185.22 |
| 2013/0148427 A1* | 6/2013 | Lee | 365/185.17 |
| 2013/0170302 A1* | 7/2013 | Hong et al. | 365/185.18 |

* cited by examiner

| | Threshold Voltage | | | | SSL Bias | | | |
|---|---|---|---|---|---|---|---|---|
| | 1st SSL | 2nd SSL | 3rd SSL | 4th SSL | 1st SSL | 2nd SSL | 3rd SSL | 4th SSL |
| 1st layer | 3 V | -1 V | 3 V | -1 V | 3.5 V | 0 V | 3.5 V | 0 V |
| 2nd layer | 3 V | -1 V | 2 V | 1 V | 3.5 V | 0 V | 2.5 V | 1.5 V |
| 3rd layer | 3 V | -1 V | 1 V | 2 V | 3.5 V | 0 V | 1.5 V | 2.5 V |
| 4th layer | 3 V | -1 V | -1 V | 3 V | 3.5 V | 0 V | 0 V | 3.5 V |
| 5th layer | 2 V | 1 V | 3 V | -1 V | 2.5 V | 1.5 V | 3.5 V | 0 V |
| 6th layer | 2 V | 1 V | 2 V | 1 V | 2.5 V | 1.5 V | 2.5 V | 1.5 V |
| 7th layer | 2 V | 1 V | 1 V | 2 V | 2.5 V | 1.5 V | 1.5 V | 2.5 V |
| 8th layer | 2 V | 1 V | -1 V | 3 V | 2.5 V | 1.5 V | 0 V | 3.5 V |
| 9th layer | 1 V | 2 V | 3 V | -1 V | 1.5 V | 2.5 V | 3.5 V | 0 V |
| 10th layer | 1 V | 2 V | 2 V | 1 V | 1.5 V | 2.5 V | 2.5 V | 1.5 V |
| 11th layer | 1 V | 2 V | 1 V | 2 V | 1.5 V | 2.5 V | 1.5 V | 2.5 V |
| 12th layer | 1 V | 2 V | -1 V | 3 V | 1.5 V | 2.5 V | 0 V | 3.5 V |
| 13th layer | -1 V | 3 V | 3 V | -1 V | 0 V | 3.5 V | 3.5 V | 0 V |
| 14th layer | -1 V | 3 V | 2 V | 1 V | 0 V | 3.5 V | 2.5 V | 1.5 V |
| 15th layer | -1 V | 3 V | 1 V | 2 V | 0 V | 3.5 V | 1.5 V | 2.5 V |
| 16th layer | -1 V | 3 V | -1 V | 3 V | 0 V | 3.5 V | 0 V | 3.5 V |

FIG. 5

| | LASER | LSM |
|---|---|---|
| Maximum number of selectable layers | $_nC_r$ | $2^n$ |
| SSL n=2 | 2 layers | 4 layers |
| SSL n=3 | 3 layers | 4 layers (n is an odd number) |
| SSL n=4 | 6 layers | 16 layers |
| SSL n=5 | 10 layers | 16 layers (n is an odd number) |
| SSL n=6 | 20 layers | 64 layers |

|  | Selected Layer | Unselected Layer |
|---|---|---|
| CSL | 0V | 0V |
| GSL | 0V (Vt=-1V erased) | 0V (Vt=1V) |
| Selected SSL | Vpgm | Vpgm |
| Unselected SSL | Vpass | Vpass |
| WL | Vpass | Vpass |
| BL | 0V | 0V |
| 1st SSL (Vt=3V) OR Dummy SSL | 0V | 0V |
| Channel | ~ 0V | Self-boosting -> boosting by GSL |

|  | Selected Layer | Unselected Layer |
|---|---|---|
| CSL | 0V | 0V |
| GSL | 1V | 1V |
| Body | 0V | -7V |
| Selected SSL | Vpgm | Vpgm |
| Unselected SSL | Vpass | Vpass |
| WL | Vpass | Vpass |
| BL | 0V | 0V |
| 1st SSL (Vt=3V) OR Dummy SSL | 0V | 0V |
| Channel | ~ 0V | Self-boosting -> boosting by GSL |

FIG. 12

|  | Program | Read | Erase |
|---|---|---|---|
| CSL | 0V | 0V | Floating |
| GSL | 0V | Vcc | Floating |
| Body | 0V | 0V | Verase |
| Selected WL | Vpgm | Vread | 0V |
| Unselected WL | Vpass | Vpass-read | Floating |
| BL | 0V | Vcc | Floating |
| SSL | Layer selection | Layer selection | Floating |

3D STACKED NAND FLASH MEMORY ARRAY ENABLING TO OPERATE BY LSM AND OPERATION METHOD THEREOF

CROSS-REFERENCE TO RELATED APPLICATION

This application claims priority under 35 U.S.C. 119 of Korean Patent Application No. 10-2012-0019349 filed on Feb. 24, 2012, the entire contents of which are hereby incorporated by reference.

BACKGROUND OF INVENTION

1. Field of the Invention

The present invention relates to a 3D stacked NAND flash memory array and operation method thereof, and more particularly to a 3D stacked NAND flash memory array enabling a layer selection by multi-level operation (LSM), which gets rid of the waste of unnecessary areas by minimizing an increase in the number of string selection lines (SSLs) though vertically stacked layers are increased, and to an operation method of the same array.

2. Description of the Related Art

Recently, the utilization of flash memories as high integrity mass storage devices has been increasing, but there has been difficult in improving the degree of integrity under 20 nm due to limitation of the photolithography technology. So, various NAND flash memory arrays enabling three-dimensional (3D) stack have been studied.

When the memory structure having a 3D stacked shape is compared with the conventional two-dimensional (2D) planar structure, the greatest difference is a necessity of a layer selection in the 3D stacked memory structure during operation.

These days, the various 3D structures enabling a layer selection in the operation of writing (a program) and reading (a read) are being studied. One example is a 3D NAND flash memory array distinguishing stacked layers from each other by electrical erases 52 described in FIG. 1 and Korean Publication No. 10-2011-0111166.

The prior art is known as a structure performing a layer selection by erase operation (LASER). According to this structure, each SSL (LSL shown in FIG. 1 of Korean Publication No. 10-2011-0111166 is equal to SSL) and a body of an active line separately formed by each layer are used to extract electrons from a specific charge storage layer between the SSL and the body of the active line in each layer for electrically forming an erase state combination, namely an initialized state combination, instead of the impurity-doped layer combination physically formed in the conventional Korean Patent No. 10-1036155. So, it has merits that the layer selection can be more easily performed.

Figure 2:
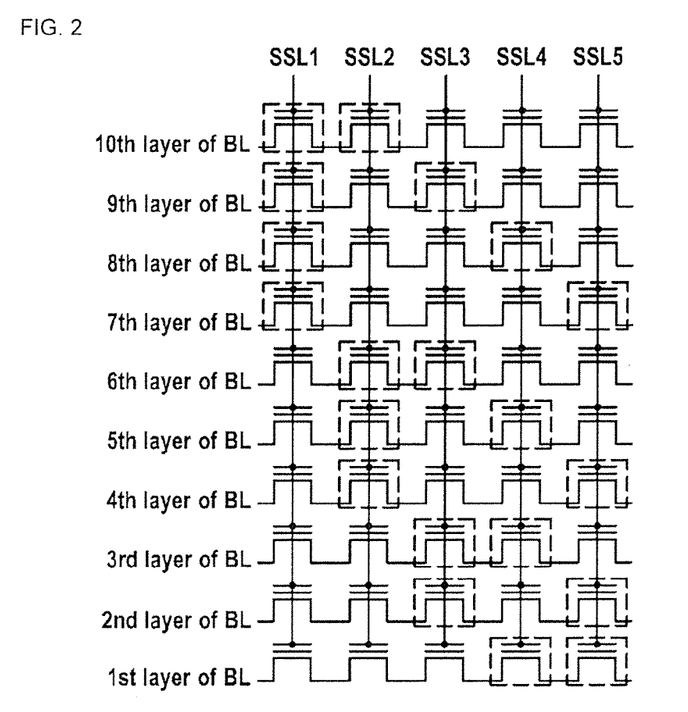
FIG. 2 is a circuit diagram showing arrangement of string selection transistors initialized electrically by string selection lines drawn in FIG. 1 for performing a layer selection.

However, because the LASER structure, as shown in FIG. 2, is consisted of string selection transistors formed at locations crossed between each SSL and an active line (each layer of bit lines) and simply divided into initialized transistors (the transistors enclosed with a broken line in FIG. 2) and not, there have been some limitations in improving the degree of integrity by minimizing the number of SSLs for a layer selection.

When n is the number of SSLs and r is the number of initialized string selection transistors formed in each active line, the number of vertically stacked layers to be selected is equal to a combination expressed as nCr. To obtain the maximum value of nCr, r has to be the closest natural number to the middle value of n.

Therefore, the LASER structure, as shown in FIG. 2, needs 5 SSLs for selecting 10 layers and also shows that the more the number of layers increases, the more the number of SSLs is needed. Considering that the general width of SSL, i.e., the gate length of a string selection transistor, is 4-5 times larger than that of a memory cell gate (the width of a word line in FIG. 1) to overcome some problems such as a leakage current, short channel effect, etc., there has been gradually rising necessity to maximally and effectively restrain the increase in the number of required SSLs though the number of vertically stacked layers is increased.

SUMMARY OF THE INVENTION

To solve the problem of the conventional technology, the present invention is directed to provide a 3D stacked NAND flash memory array and operation method thereof for improving the degree of integrity by minimizing the number of SSLs needed for a layer selection though the number of layers of vertically stacked active lines in a 3D NAND flash memory array is increased.

To achieve the objectives, a 3D stacked NAND flash memory array is comprising: a plurality of active lines formed at regular intervals in a first horizontal direction with a plurality of semiconductor layers vertically stacked having insulating films between upper and lower layers on a substrate; a plurality of word lines formed at regular intervals in a second horizontal direction to be vertically aligned to each of the active lines and to pass by the plurality of semiconductor layers with insulating layers including a charge storage layer between each of the world lines and the semiconductor layers; and a plurality of string selection lines formed at regular intervals in the second horizontal direction to be parallel to each of the word lines on one side of the plurality of word lines and to pass by the plurality of semiconductor layers with insulating layers including a charge storage layer between each of the string selection lines and the semiconductor layers, wherein each of the string selection lines forms a plurality of string selection transistors vertically stacked passing by the plurality of semiconductor layers, and wherein the plurality of string selection transistors vertically stacked have three or more different threshold voltages to be increased or decreased toward the lower ones by programming the charge storage layer interlaid between each of the string selection lines and the semiconductor layers.

Here, the different threshold voltages can be reversely increased or decreased toward the lower ones between adjacently and vertically stacked string selection transistors among the plurality of string selection transistors.

When a number of the plurality of string selection lines is n, a number of vertically stacked layers of the plurality of semiconductor layers can be $2^n$ according to n being an even number.

And the 3D stacked NAND flash memory array can be further comprising a ground selection line formed at a regular interval in the second horizontal direction to be parallel to each of the word lines on the other side of the plurality of word lines and to pass by the plurality of semiconductor layers with insulating layers between the ground selection line and the semiconductor layers.

Here, each of the active lines can be electrically connected to each bit line on one end of the plurality of semiconductor layers adjacent to the string selection lines and the one end can be electrically connected between the upper and lower layers vertically, another end of the plurality of semiconductor layers can be electrically connected in the same layer horizontally by the ground selection line, and another end of the plurality of semiconductor layers adjacent to the ground selection line can be formed as a wall-shaped body contact part having one end of a stair shape for contacting to each of the semiconductor layers.

The ground selection line can be formed to wrap around one side of the body contact part, and a common source line can be further formed to vertically and partially contact to at least one portion of the ground selection line on another end or side of the body contact part.

Each layer of the body contact part can be connected each other by a common body in the same layer among the plurality of semiconductor layers, and the ground selection line can form a plurality of ground selection transistors and passes by the plurality of semiconductor layers with insulating layers including a charge storage layer between the ground selection line and the semiconductor layer as like as the plurality of string selection lines and word lines.

On the other hand, an operation method of the 3D stacked NAND flash memory array according to the present invention is comprising the steps of: selecting a semiconductor layer formed into string selection transistors to be programmed among the plurality of string selection transistors through the body contact part, getting ground selection transistors formed in the selected semiconductor layer to produce a threshold voltage difference from the other ground selection transistors formed in an unselected semiconductor layer, and programming each of the string selection transistors by using the threshold voltage difference of the ground selection transistors.

Here, the ground selection transistors formed in the selected semiconductor layer can be erased to produce the threshold voltage difference from the other ground selection transistors formed in the unselected semiconductor layers.

The string selection transistors to be programmed and formed in the selected semiconductor layer can be programmed by firstly programming a first string selection transistors formed with a string selection line nearest to a contact of the each bit line to get a threshold voltage as high as an electrical connection to the each bit line is cut off, next programming the other string selection transistors, and then again programming the first string selection transistors to get a required threshold voltage.

The ground selection transistors formed in the selected semiconductor layer can have the threshold voltage difference from the other ground selection transistors formed in an unselected semiconductor layer by applying a body bias through the body contact part.

The string selection transistors to be programmed and formed in the selected semiconductor layer can be programmed by firstly programming a first string selection transistors formed with a string selection line nearest to a contact of the each bit line to get a threshold voltage as high as an electrical connection to the each bit line is cut off, next programming the other string selection transistors, and then again programming the first string selection transistors to get a required threshold voltage.

The present invention can innovatively improve the degree of integrity by minimizing the number of SSLs needed for a layer selection though the number of layers of vertically stacked active lines in a 3D stacked NAND flash memory array is increased.

In these drawings, the following reference numbers are used throughout: reference number 10 indicates a substrate, 20 a stacked buffer layer, 30 a semiconductor layer, 34 a stair-shaped contact part, 40 and 42 an insulating film, 50 an insulating layer including a charge storage layer, 52 an initialized (erased) charge storage layer, 62 a string selection line, 64 a word line, 70 a contact plug, and 72 a bit line.

DETAILED DESCRIPTION OF THE PREFERRED EMBODIMENTS

Detailed descriptions of preferred embodiments of the present invention are provided below with accompanying drawings.

Figure 1:
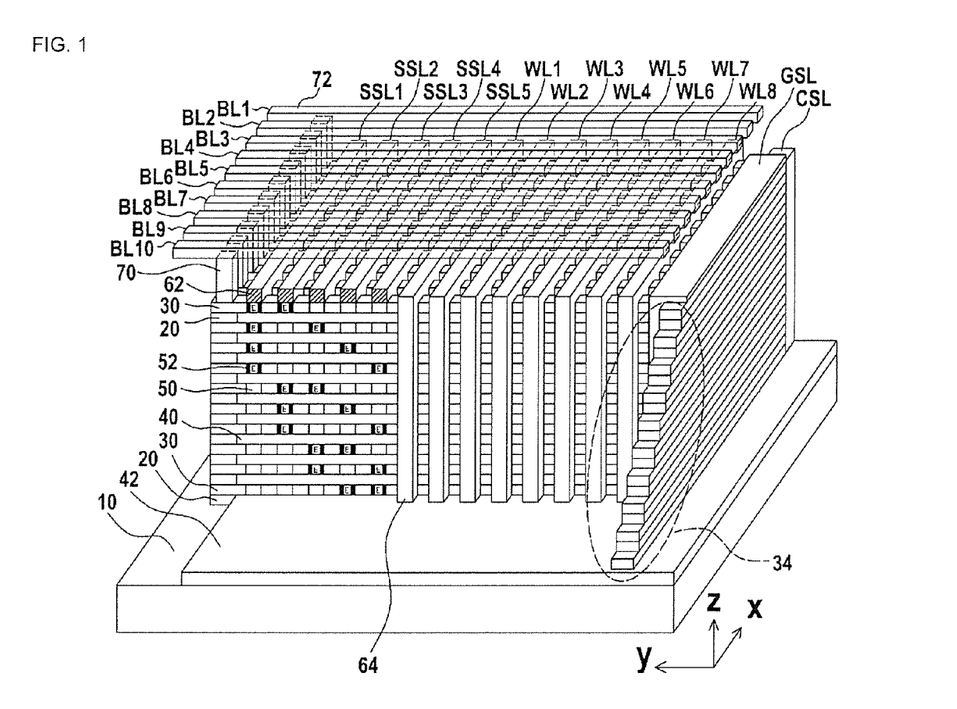
FIG. 1 is a perspective view showing a 3D stacked NAND flash memory array performing a layer selection by the conventional LASER method.
Figure 3:
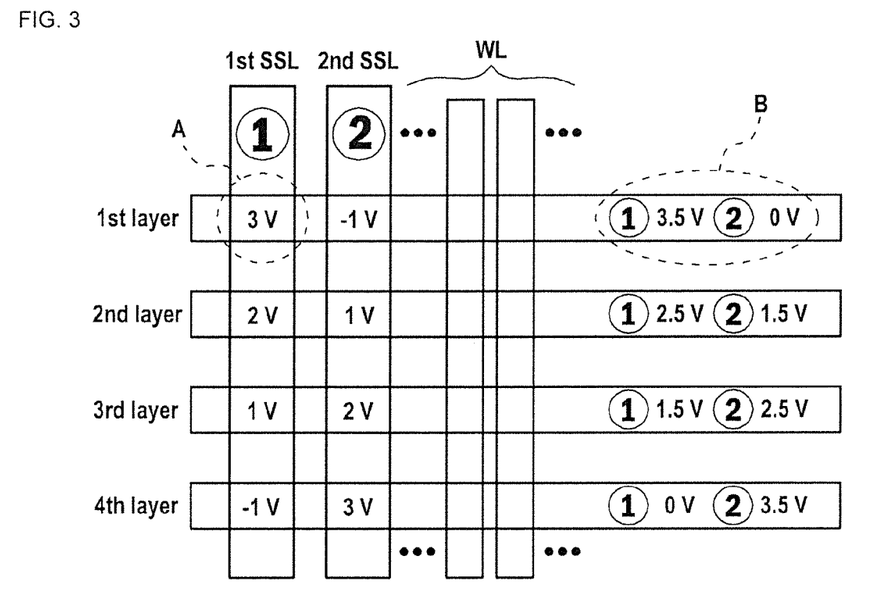
FIG. 3 is a conceptive diagram drawn together with biases for selecting each of four stacked semiconductor layers by two string selection lines in a 3D stacked NAND flash memory array according to an embodiment of the present invention.

First, a 3D stacked NAND flash memory array according to an embodiment of the present invention is comprising: as drawn in FIG. 1, a plurality of active lines (for example, lines connected to bit lines BL1 to BL10) formed at regular intervals in a first horizontal direction (for example, in an x-axis direction) with a plurality of semiconductor layers 30 vertically stacked having insulating films 40 between upper and lower layers on a substrate 10; a plurality of word lines 64 (for example, WL1 to WL8) formed at regular intervals in a second horizontal direction (for example, in a y-axis direction) to be vertically aligned to each of the active lines and to pass by the plurality of semiconductor layers 30 with insulating layers 50 including a charge storage layer between each of the world lines and the semiconductor layers; and a plurality of string selection lines 62 (for example, SSL1 to SSL5) formed at regular intervals in the second horizontal direction (for example, in a y-axis direction) to be parallel to each of the word lines on one side of the plurality of word lines and to pass by the plurality of semiconductor layers 30 with insulating layers 50 including a charge storage layer between each of the string selection lines 62 and the semiconductor layers 30, as shown in FIG. 3, wherein each of the string selection lines 62 (1st SSL or 2nd SSL) forms a plurality of string selection transistors (for example, A) vertically stacked passing by the plurality of semiconductor layers 30 (1st layer, 2nd layer, 3rd layer and 4th layer), and wherein the plurality of string selection transistors vertically stacked have three or more different threshold voltages (four different threshold voltages are shown in FIG. 3) to be increased or decreased toward the lower ones by programming the charge storage layer interlaid between each of the string selection lines 62 and the semiconductor layers 30.

Here, the different threshold voltages are reversely increased or decreased toward the lower ones between adjacently and vertically stacked string selection transistors among the plurality of string selection transistors, in other words, as shown in FIG. 3, between two adjacently and vertically stacked string selection transistors formed by two string selection lines (1st SSL and 2nd SSL) which adjacently pass by the plurality of semiconductor layers 30 (1st layer, 2nd layer, 3rd layer and 4th layer) by differently programming the charge storage layer of each of the string selection transistors. FIG. 3 shows that the first coulomb string selection transistors by the first string selection line (1st SSL) have the threshold voltages sequentially decreased toward the lower ones, while the second coulomb string selection transistors, adjacent to the the first coulomb string selection transistors, by the second string selection line (2nd SSL) have the threshold voltages sequentially increased toward the lower ones.

A gate insulator of each of the string selection transistor can be formed with insulating layers 50 including a charge storage layer, for example, ONO layers (Oxide/Nitride/Oxide layers) as in a memory cell device formed by each word line 64.

Therefore, as shown in FIG. 3, by differently programming the charge storage layer of each of the string selection transistors, it can be configured that the 1st vertically stacked string selection transistors formed by the 1st string selection line (1st SSL; ①) have threshold voltages which are sequentially decreased toward the lower layers (for example, 3V, 2V, 1V and −1V), while the 2nd vertically stacked string selection transistors formed by the 2nd string selection line (2nd SSL; ②) have threshold voltages which are sequentially increased toward the lower layers (for example, −1V, 1V, 2V and 3V).

By the above mentioned embodiment, only two string selection lines can dividedly select four layers by operating as a bias scheme (B) of each string selection line drawn in FIG. 3.

In other words, as shown in FIG. 3, when 3.5V and 0V are applied to the 1st string selection line (1st SSL; ①) and the 2nd string selection line (2nd SSL; ②), respectively, all string selection transistors having 3V to −1V threshold voltage are turned on and the 1st semiconductor layer (1st layer) is only selected, namely, electrically connected to a bit line, while the other semiconductor layers cannot be electrically connected to bit lines because 2nd vertically stacked string selection transistors having 1V, 2V or 3V threshold voltage are turned off.

By the same method, when 2.5V and 1.5V are applied to the 1st string selection line (1st SSL; ①) and the 2nd string selection line (2nd SSL; ②), respectively, all string selection transistors having 2V or 1V threshold voltage are turned on and the 2nd semiconductor layer (2nd layer) is only connected by a bit line, while the other semiconductor layers cannot be connected to bit lines because at least one string selection transistor formed on each of the other semiconductor layers is turned off.

As the above mentioned, it is configured that a plurality of vertically stacked string selection transistors formed by each string selection line have three or more different threshold voltages and the threshold voltages between two adjacently and vertically stacked string selection transistors are increased or decreased toward the lower layers by each other inverse sequence. If a layer selection is performed by LSM (a layer selection by multi-level operation) method, a number of SSL, n, can be increased into an even number.

As shown in FIG. 3, when the number of SSL is 2, four layers can be selected because the number of cases (namely, the number of combinations of threshold voltage arrangements) is 4. If two SSLs are further added in the embodiment of FIG. 3, total 16 layers can be selected, as shown in FIG. 4, because the number of cases per each layer is 4.

By LSM method under the above mentioned principle, n SSLs can select $2^n$ semiconductor layers where n is an even number. If n is an odd number, $2^{n-1}$ semiconductor layers can be selected (refer to FIG. 5). Thus, it can select much more layers than the prior LASER method determining the number of selectable layers by nCr.

Figure 4:
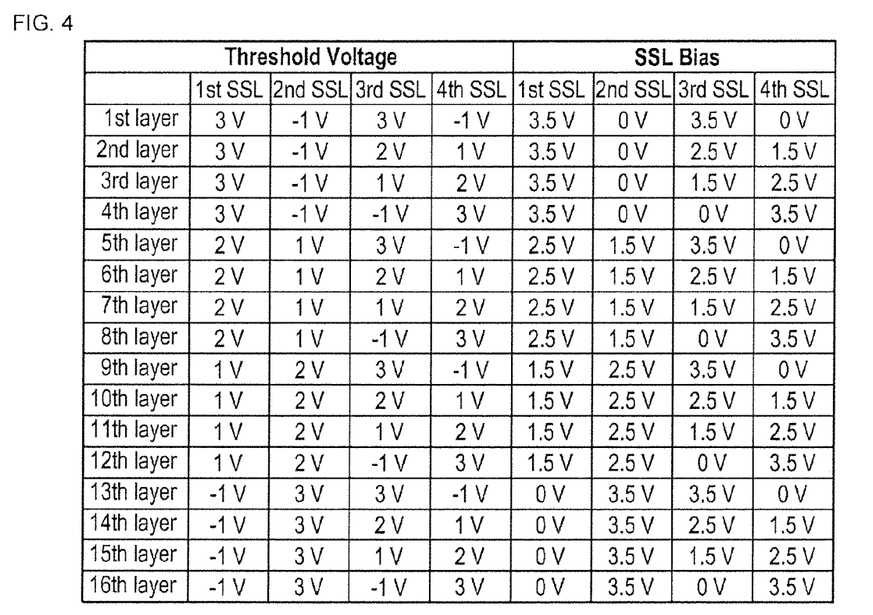
FIG. 4 is an operation scheme table showing biases for selecting each of sixteen stacked semiconductor layers by four string selection lines in a 3D stacked NAND flash memory array according to an embodiment of the present invention.

FIG. 4 is an operation scheme table showing biases for selecting each of sixteen stacked semiconductor layers by four string selection lines (SSLs) in a 3D stacked NAND flash memory array according to an embodiment of the present invention. In FIG. 4, Threshold Voltage is threshold voltages of vertically stacked string selection transistors formed by each string selection line (1st SSL, 2nd SSL, 3rd SSL or 4th SSL) and SSL Bias is a bias scheme of each string selection line for selecting each layer.

Figure 5:
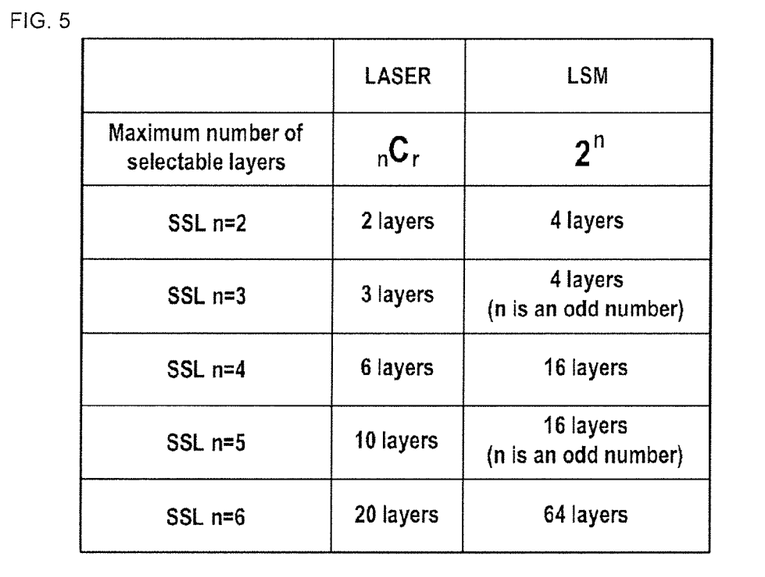
FIG. 5 is a comparison table showing the maximum number of layers which can be selected by LASER method of the prior art and LSM method of the present invention, respectively.
Figure 6:
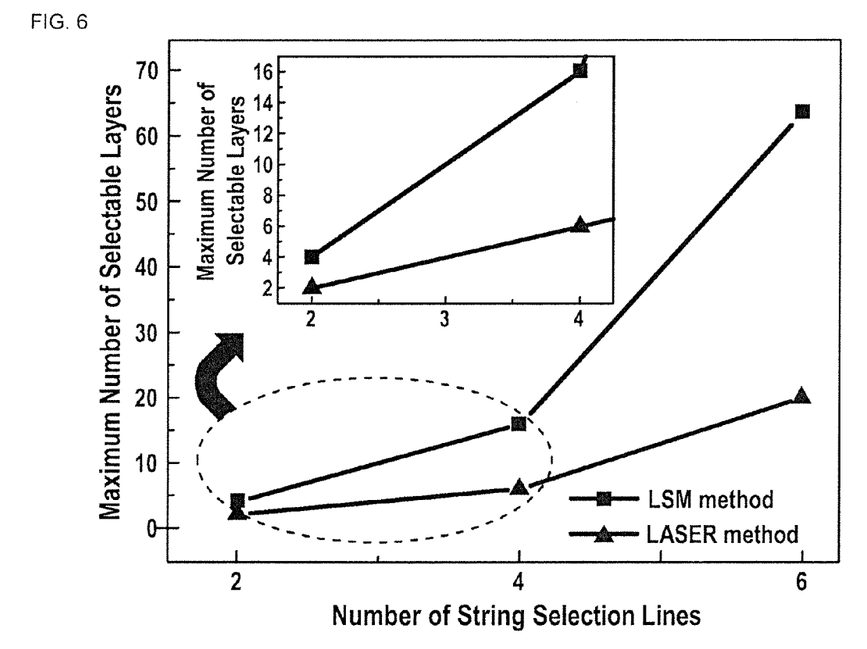
FIG. 6 is a graphic diagram of FIG. 5.

FIG. 5 is a comparison table showing the maximum number of layers which can be selected by LASER method of the prior art and LSM method of the present invention, respectively. FIG. 6 is a graphic diagram of FIG. 5. As known from FIGS. 5 and 6, the more the number of layers is increased, the more the difference between the prior LASER method and the present invention's LSM method is remarkably increased. For example, when six SSLs are formed, the prior LASER method can select 20 layers, but the present invention's LSM method can select 64 layers.

Therefore, the 3D stacked array structure operated by LSM method according to the present invention enables to remarkably decrease the number of SSL required in a layer selection than that operated by the prior LASER method for improving the degree of integrity.

Figure 7:
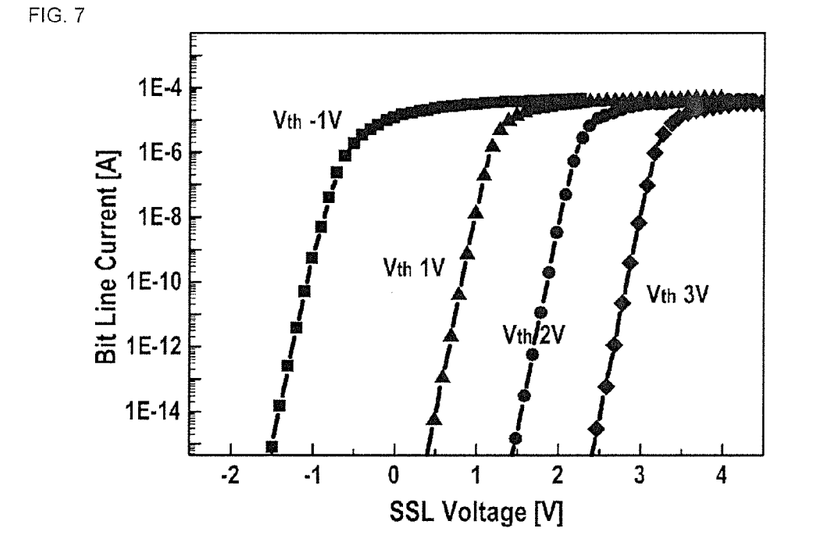
FIG. 7 is an I-V characteristic diagram according to a threshold voltage difference of vertically stacked string selection transistors by each of string selection lines.

FIG. 7 is an I-V characteristic diagram according to a threshold voltage difference of vertically stacked string selection transistors formed in each string selection line, namely a simulation result diagram showing a relationship between a bit line current and a string selection line voltage.

On the other hand, the 3D stacked NAND flash memory array can further comprise a ground selection line (GSL) formed at a regular interval in the second horizontal direction (y-axis direction) to pass by the plurality of semiconductor layers 30 interlaying an insulating layer 50 and to be parallel to each word line 64 on another side of the plurality of word lines 64 (WL1 to WL8) as shown in FIG. 1.

And each active line is electrically connected to each bit line 72 through a predetermined contact plug 70 on one end adjacent to the string selection lines 62, the one ends of the plurality of semiconductor layers 30, as shown in FIG. 1, are electrically connected vertically between upper and lower layers by a conductive material layer 20 and the opposite ends of the plurality of semiconductor layers 30 are electrically connected horizontally in the same layer by the ground selection line (GSL).

And the opposite ends of the plurality of semiconductor layers 30 adjacent to the ground selection line (GSL) can be formed as a wall-shaped body contact part having one end of a stair shape 34 for contacting to the each semiconductor layer.

And the ground selection line (GSL), as shown in FIG. 1, is formed to wrap around one side of the body contact part and a common source line (CSL) can be further formed to vertically and partially contact to at least one portion of the ground selection line on another end or side of the body contact part.

At this time, each layer of the body contact part is connected each other by a common body in the same layer among the plurality of semiconductor layers 30.

And the ground selection line (GSL) forms a plurality of ground selection transistors by passing by the plurality of semiconductor layers 30 with insulating layers 50 including a charge storage layer between the ground selection line and the each semiconductor layer in the same way as the plurality of string selection lines 62 (SSLs) and word lines 64 (WLs).

Next, an operation method of the 3D stacked NAND flash memory array according to the above embodiment is especially described as an embodiment about a method for programming a charge storage layer of the each string selection transistor.

It is basically comprising the steps of: selecting a semiconductor layer 30 formed into string selection transistors to be programmed among the plurality of string selection transistors through the body contact part, getting ground selection transistors formed in the selected semiconductor layer to produce a threshold voltage difference from the other ground selection transistors formed in an unselected semiconductor layer, and programming each of the string selection transistors by using the threshold voltage difference of the ground selection transistors.

At this time, the threshold voltage difference of the ground selection transistors can be embodied by the following two methods.

Figure 8:
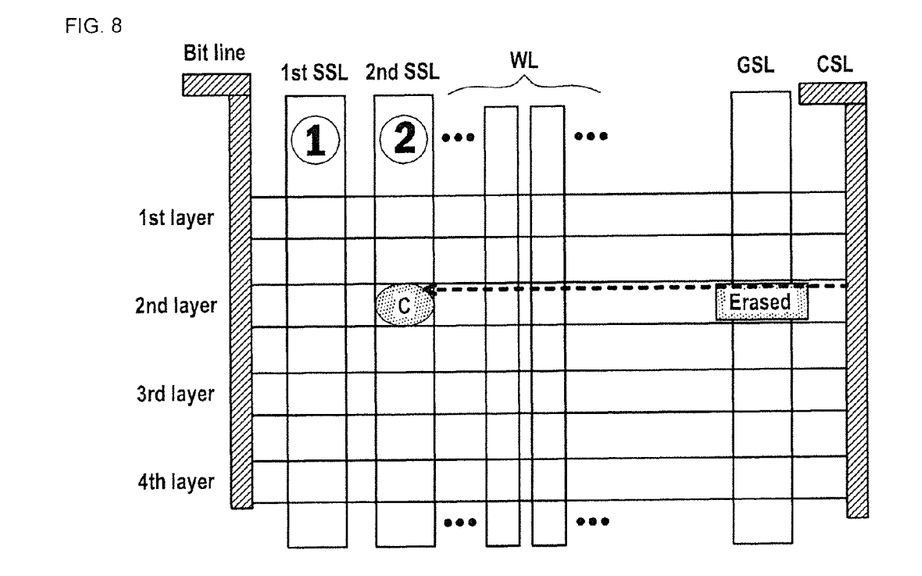
FIG. 8 is a conceptive diagram for explaining a control method of threshold voltages of string selection transistors by erasing a ground selection transistor of each layer in a ground selection line.

A first method, as shown in FIG. 8, is that ground selection transistors formed in the selected semiconductor layer are erased to produce the threshold voltage difference but ground selection transistors formed in unselected semiconductor layers are not.

Figure 9:
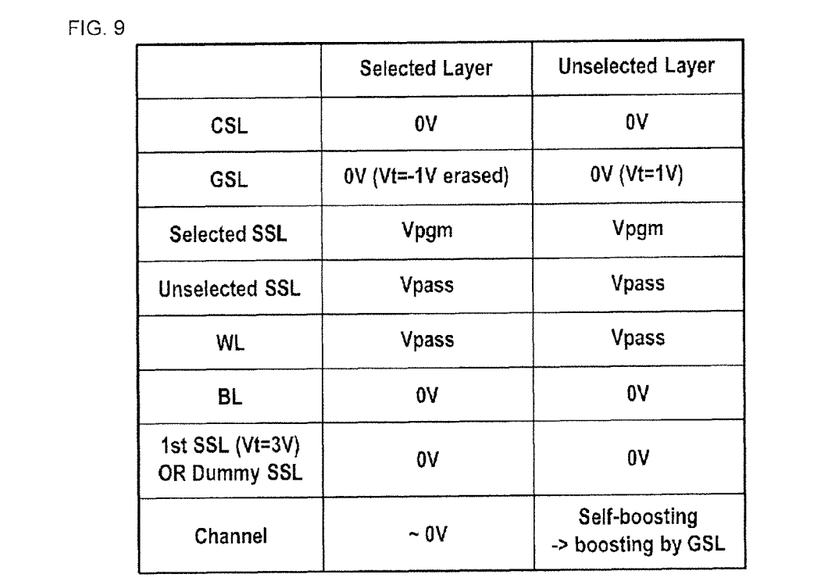
FIG. 9 is a program bias scheme for controlling threshold voltages of string selection transistors according to FIG. 8.

By the mentioned method, for example, as shown in FIG. 9, when a ground selection line (GSL) and a common source line (CSL) are applied with 0V, respectively, ground selection transistors formed in the selected semiconductor layer are turned on and 0V bias of a common source line (CSL) flows into a channel of each active line of the selected semiconductor layer, but the other ground selection transistors formed in unselected semiconductor layers are remained to a turn-off state for occurring a self-boosting effect in a channel of each active line connected to the unselected semiconductor layers.

For maintaining the self-boosting effect occurred in a channel of each active line of the unselected semiconductor layers, a bit line voltage applied from the opposite side of a common source line (CSL) must be cut off.

Methods for blocking the bit line voltage include a dummy SSL method using a dummy SSL additionally formed between a bit line and a 1st SSL, and a 1st SSL method using a 1st SSL as a blocking means to cut off a bit line voltage.

The dummy SSL method is simple, but takes a disadvantage of areal loss due to an additional SSL. Thus, it is preferable to cut off the bit line voltage by the 1st SSL method using the 1st SSL.

Here, the 1st SSL is SSL1, as shown in FIG. 1, located nearest to a contact 70 of each bit line.

In the case of using the 1st SSL for blocking a bit line voltage, once for programming the other selection transistors according to a 2nd and after SSLs to get a threshold voltage of a required state, first, string selection transistors according to the 1st SSL are programmed to get a threshold voltage as high as an electrical connection of each bit line is cut off. Second, the other string selection transistors are all programmed to get the required state by controlling a biased-voltage size and time using an erase operation. And then the string selection transistors according to the 1st SSL are again programmed to get a required threshold voltage.

When a program operation of string selection transistors of one layer is completed, ground selection transistors according to a ground selection line (GSL) are initialized, ground selection transistors according to a required layer are again erased and then the above mentioned processes are repeated.

A second method for embodying the threshold voltage difference between the ground selection transistors is that a body bias is applied through the body contact part.

Figure 10:
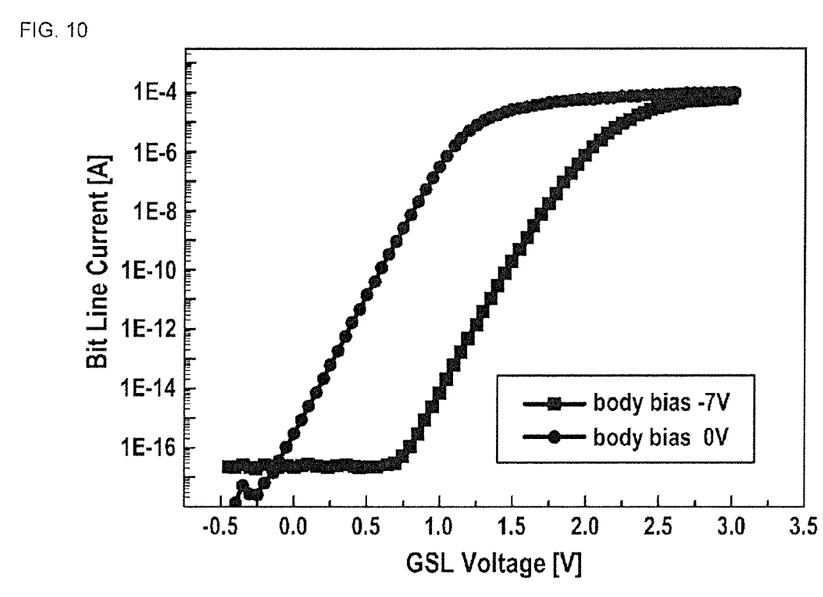
FIG. 10 is an I-V characteristic diagram showing that a body bias through a body contact part enables threshold voltages of ground selection transistors of each layer to be different.

In other words, when a body bias is applied through the body contact part, ground selection transistors formed in the selected semiconductor layer can produce the threshold voltage difference differently from the other ground selection transistors formed in unselected semiconductor layers, as shown in FIG. 10, according to whether a body bias is applied or not.

Figure 11:
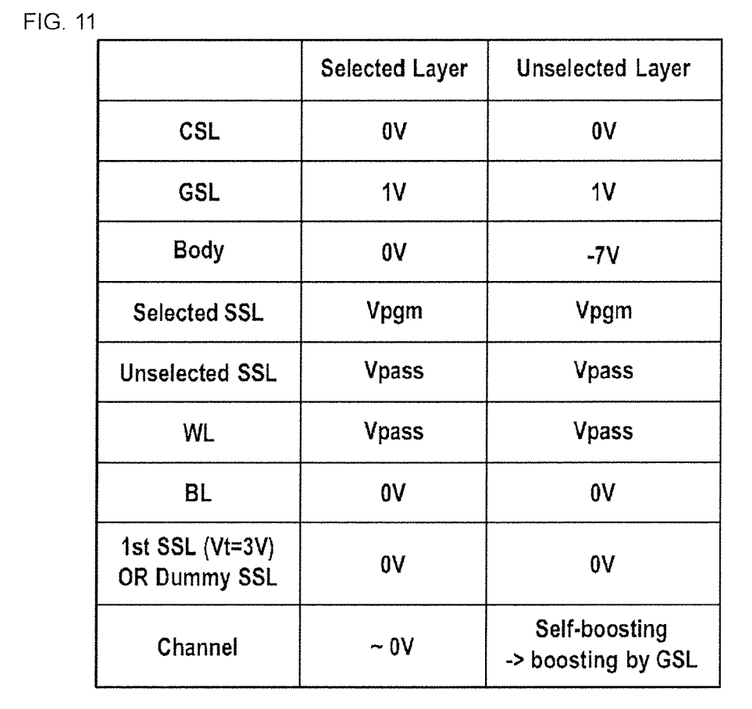
FIG. 11 is a program bias scheme for controlling threshold voltages of string selection transistors according to FIG. 10.

This case has only a different point in applying a body bias through a body contact part into the selected semiconductor layer instead of erasing ground selection transistors of the selected semiconductor layer in the first method. Since a self-boosting effect can be used in this operation, bias voltages can be applied as shown in FIG. 11 for one embodiment.

Figure 12:
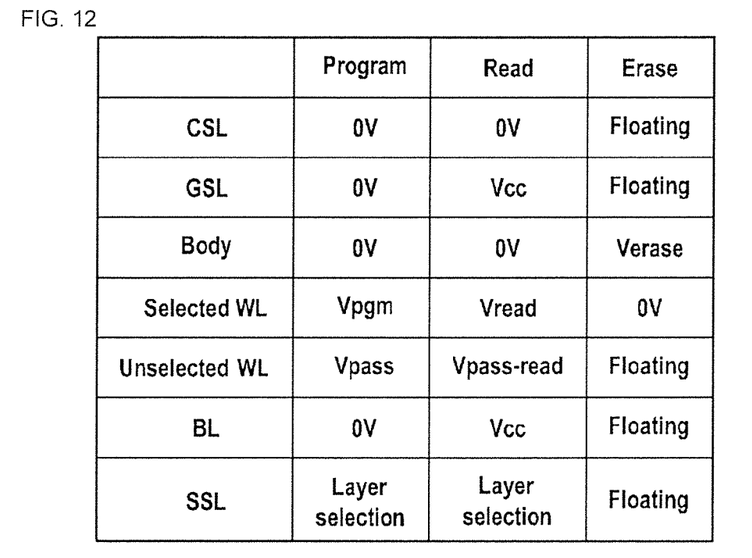
FIG. 12 is a bias scheme for program, read and erase operations in a 3D stacked NAND flash memory array according to an embodiment of the present invention.

The rest, operation methods for program, read and erase of memory cell devices formed by word lines 64 in FIG. 1 can be embodied, for example, as shown in FIG. 12. Since it is the same as the prior LASER method, the detailed description is omitted.

Figure 13:
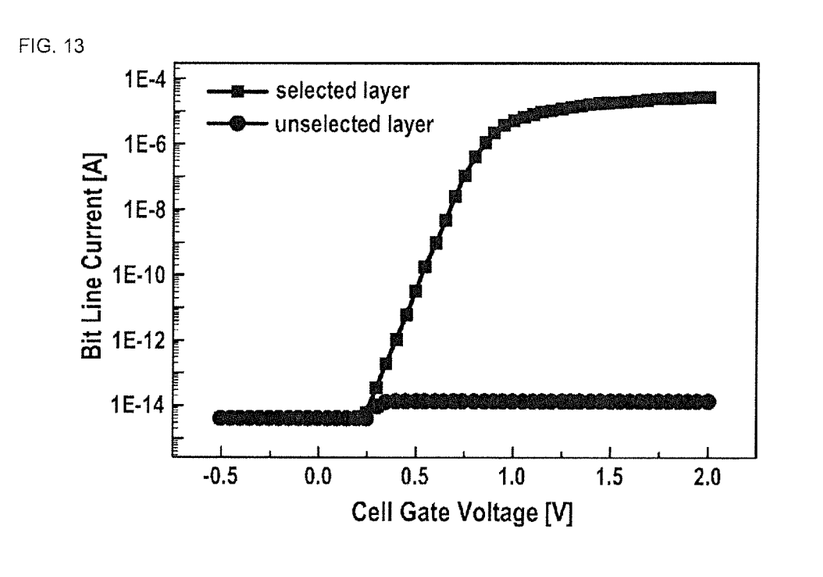
FIG. 13 is an I-V characteristic diagram showing a comparison of current size between the selected and unselected layers in case of a read operation by a 3D stacked NAND flash memory array according to an embodiment of the present invention.

FIG. 13 is an I-V characteristic diagram showing comparison of current size between the selected and unselected layers in case of read operation by a 3D stacked NAND flash memory array according to an embodiment of the present invention. From FIG. 13, it is known that a cell current can only flow into the selected and required layer, but not the unselected layer.

What is claimed is:

1. A 3D stacked NAND flash memory array comprising:
   a plurality of active lines formed at regular intervals in a first horizontal direction with a plurality of semiconductor layers vertically stacked having insulating films between upper and lower layers on a substrate;
   a plurality of word lines formed at regular intervals in a second horizontal direction to be vertically aligned to each of the active lines and to pass by the plurality of semiconductor layers with insulating layers including a charge storage layer between each of the world lines and the semiconductor layers; and
   a plurality of string selection lines formed at regular intervals in the second horizontal direction to be parallel to each of the word lines on one side of the plurality of word lines and to pass by the plurality of semiconductor layers with insulating layers including a charge storage layer between each of the string selection lines and the semiconductor layers, wherein each of the string selection lines forms a plurality of string selection transistors vertically stacked passing by the plurality of semiconductor layers, wherein the plurality of string selection transistors vertically stacked have three or more different threshold voltages to be increased or decreased toward the lower ones by programming the charge storage layer interlaid between each of the string selection lines and the semiconductor layers, and wherein the different threshold voltages are reversely increased or decreased toward the lower ones between adjacently and vertically stacked string selection transistors among the plurality of string selection transistors.

2. The 3D stacked NAND flash memory array of claim 1, wherein a number of the plurality of string selection lines is n, and wherein a number of vertically stacked layers of the plurality of semiconductor layers is $2^n$ when n is an even number.

3. The 3D stacked NAND flash memory array of claim 2, further comprising a ground selection line formed at a regular interval in the second horizontal direction to be parallel to each of the word lines on the other side of the plurality of word lines and to pass by the plurality of semiconductor layers with insulating layers between the ground selection line and the semiconductor layers.

4. The 3D stacked NAND flash memory array of claim 3, wherein each of the active lines is electrically connected to each bit line on one end of the plurality of semiconductor layers adjacent to the string selection lines and the one end is electrically connected between the upper and lower layers vertically, wherein another end of the plurality of semiconductor layers is electrically connected in the same layer horizontally by the ground selection line, and wherein another end of the plurality of semiconductor layers adjacent to the ground selection line is formed as a wall-shaped body contact part having one end of a stair shape for contacting to each of the semiconductor layers.

5. The 3D stacked NAND flash memory array of claim 4, wherein the ground selection line is formed to wrap around one side of the body contact part, and wherein a common source line is further formed to vertically and partially contact to at least one portion of the ground selection line on another end or side of the body contact part.

6. The 3D stacked NAND flash memory array of claim 5, wherein each layer of the body contact part is connected each other by a common body in the same layer among the plurality of semiconductor layers, and wherein the ground selection line forms a plurality of ground selection transistors and passes by the plurality of semiconductor layers with insulating layers including a charge storage layer between the ground selection line and the semiconductor layer as like as the plurality of string selection lines and word lines.

7. An operation method of the 3D stacked NAND flash memory array according to claim 6, comprising the steps of:
selecting a semiconductor layer formed into string selection transistors to be programmed among the plurality of string selection transistors through the body contact part, getting ground selection transistors formed in the selected semiconductor layer to produce a threshold voltage difference from the other ground selection transistors formed in an unselected semiconductor layer, and programming each of the string selection transistors by using the threshold voltage difference of the ground selection transistors.

8. The operation method of claim 7, wherein the ground selection transistors formed in the selected semiconductor layer are erased to produce the threshold voltage difference from the other ground selection transistors formed in the unselected semiconductor layers.

9. The operation method of claim 8, wherein the string selection transistors to be programmed and formed in the selected semiconductor layer are programmed by firstly programming a first string selection transistors formed with a string selection line nearest to a contact of the each bit line to get a threshold voltage as high as an electrical connection to the each bit line is cut off, next programming the other string selection transistors, and then again programming the first string selection transistors to get a required threshold voltage.

10. The operation method of claim 7, wherein the ground selection transistors formed in the selected semiconductor layer have the threshold voltage difference from the other ground selection transistors formed in an unselected semiconductor layer by applying a body bias through the body contact part.

11. The operation method of claim 10, wherein the string selection transistors to be programmed and formed in the selected semiconductor layer are programmed by firstly programming a first string selection transistors formed with a string selection line nearest to a contact of the each bit line to get a threshold voltage as high as an electrical connection to the each bit line is cut off, next programming the other string selection transistors, and then again programming the first string selection transistors to get a required threshold voltage.

* * * * *